United States Patent [19]

Gupta et al.

[11] Patent Number: 4,751,736
[45] Date of Patent: Jun. 14, 1988

[54] VARIABLE BIT RATE SPEECH CODEC WITH BACKWARD-TYPE PREDICTION AND QUANTIZATION

[75] Inventors: Vaikunth Gupta, Gaithersburg; Michael Onufry, Clarksburg; Henri Suyderhoud, Potomac; K. Virupaksha, Rockville, all of Md.

[73] Assignee: Communications Satellite Corporation, Clarksburg, Md.

[21] Appl. No.: 697,082

[22] Filed: Jan. 31, 1985

[51] Int. Cl.[4] ............................................. G10L 5/00
[52] U.S. Cl. .................................. 381/31; 375/27; 375/34
[58] Field of Search .................. 381/29–35, 381/47; 375/22, 25, 26, 30, 34, 37, 122; 358/133, 135; 332/11 D

[56] References Cited

U.S. PATENT DOCUMENTS 4,518,950 5/1985 Petr ........................................ 375/34
4,571,737 2/1986 Nishitani et al. ....................... 375/27
4,589,130 5/1986 Galand .................................. 381/31

*Primary Examiner*—Emanuel S. Kemeny
*Attorney, Agent, or Firm*—Sughrue, Mion, Zinn, Macpeak and Seas

[57] ABSTRACT

In an adaptive differential PCM (ADPCM) system transmitter, three quantizers provide, respectively, 3, 4, and 5-bit quantization at the signal sampling rate. Each quantizer produces, in response to an input signal sample, a coded signal I(n) in the form of a bit sequence the number of bits in the coded signal from each quantizer being different. The number of bits comprising the coded signal is proportional to the bit rate. The bit rate can thus be altered by switching the codec output to selected ones of the adaptive quantizers. To eliminate quantizing distortion during bit rate transitions, one adaptive quantizer is caused to operate in the dominant mode, to receive the input signal sample and produce the coded signal I(n). At the same time, the other adaptive quantizers operate in a secondary mode to update their step-size $\Delta(n)$ on the basis of the quantized signal produced by the dominant mode quantizer. When a secondary mode quantizer is switched to the dominant mode, minimal time is required for tracking the input signal thereby reducing the quantization distortion during bit rate transitions.

6 Claims, 3 Drawing Sheets

VARIABLE BIT RATE SPEECH CODEC WITH BACKWARD-TYPE PREDICTION AND QUANTIZATION

FIELD OF THE INVENTION

The invention is in the field of variable bit rate, backward type codecs, (coder/decoder) and more particlarly in the field of adaptive differential PCM (ADPCM) codecs, with an adaptive predictor and a plurality of adaptive quantizers in the feedback loop.

BACKGROUND OF THE INVENTION

In the transmission of digitized speech signals, the transmission bit rate depends on the sampling frequency and the number of bits used to quantize a speech sample. The sampling frequency is constrained by the speech bandwidth. Therefore, the bit rate can be altered only by altering the quantization precision which is directly proportional to the number of bits per sample. The feedback or as it is sometimes termed, the backward-type codec is one type of speech coding configuration available for achieving variable bit rate speech transmission. Such a backward-type codec may be established using an ADPCM codec, variable bit rate being achieved through the provision of multiple quantizers, each producing a digitized sample of a different number of bits. For example, with speech sampled at the rate of 8,000 samples/sec., transmission bit rates of 24, 32 or 40 kbits/sec. are realized with a three quantizer ADPCM system that uses a 3-bit quantizer, a 4-bit quantizer and a 5-bit quantizer.

The backward-type codec, and particulary the ADPCM codec, has advantages over the feed-forward type codec which exhibits considerable processing delay introduced by the block processing nature of a feed-forward configuration and which requires a portion of the available bit rate for transmission of the overhead information associated with each block of speech. While the backward-type codec eliminates these two drawbacks of the feedforward type codec, it suffers the disadvantage that distortion is introduced whenever the bit rate is changed, that is, whenever the codec switches from one quantizer to another. It has been determined that this distortion occurs because of the finite duration required by the quantizer stepsize to track the input signal.

SUMMARY OF THE INVENTION

An object of the invention is to provide a variable bit rate backward-type codec which eliminates the distortion accompanying bit rate changes.

A further object of the invention is to provide a variable bit rate, multiple quantizer, ADPCM codec which eliminates the distortion accompanying the switching from one quantizer to another.

These and other objects, which will be apparent from the following description of the preferred embodiment of the invention, are accomplished with a variable bit rate backward-type codec with an adaptive predictor and a plurality of adaptive quantizers in the feedback loop, one of said plurality of quantizers operating in a dominant mode, while the remaining quantizers operate in a secondary mode. The quantizer operating in the dominant mode operates on the actual difference signal, $d(n)$ defining the difference between the linear input sample, $S(n)$, and the predictor output $S_e(n)$. The quantizers operating in the secondary mode operate on the difference signal quantized by the dominant mode quantizer, $dq(n)$, to update their step-sizes $\Delta(n)$ so that when a secondary mode quantizer is forced into the dominant mode, minimal time is required for tracking the input signal, $S(n)$. Minimizing the time for tracking the input signal has been determined to reduce the quantizing distortion during bit-rate transitions.

DETAILED DESCRIPTION OF THE PREFERRED EMBODIMENT

Figure 1:
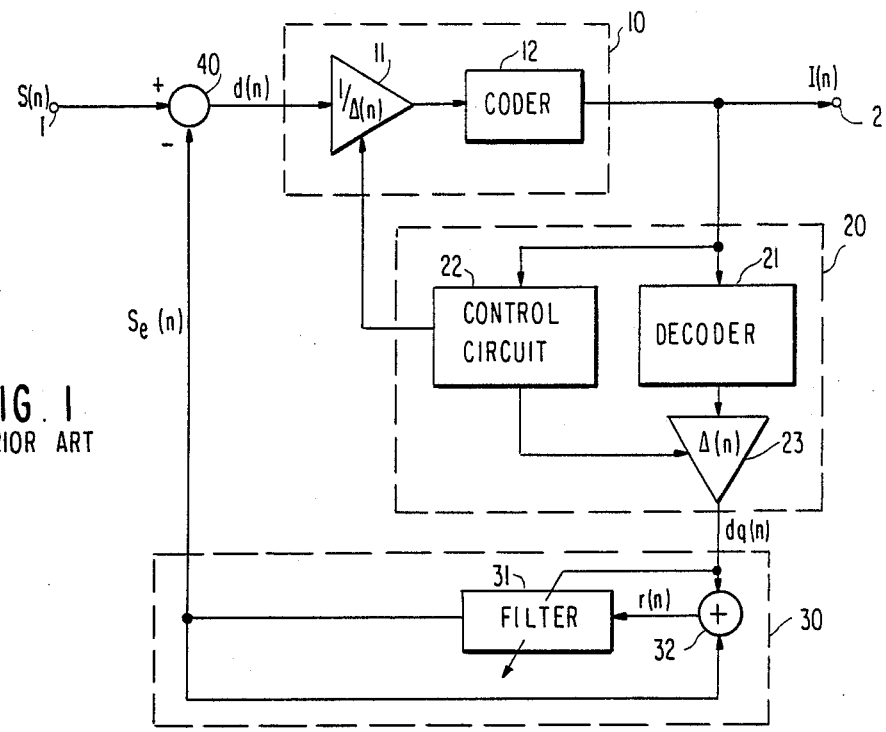
FIG. 1 is a block diagram illustrating a prior art ADPCM transmitter.

The variable bit rate backward-type codec of the invention will be described with reference to an ADPCM codec with an adaptive predictor and a plurality of adaptive quantizers. It is to be understood, however, that the invention disclosed herein is applicable to any backward-type codec and is not limited to the ADPCM system. To facilitate a full and complete understanding of the invention a conventional ADPCM system will first be reviewed. Thereafter, the ADPCM system modified in accordance with the teachings of the present invention will be described.

An ADPCM system is derived from the differential pulse code modulation system (DPCM). A DPCM system utilizes the redundancy of a speech signal for bandwidth compression. In such a system, the prediction of the amplitude of each speech signal sample at the present time point is a function of the past speech signal sample or samples. The basis for such a prediction is that speech signal samples have a high degree of correlation with each other. In the simplest DPCM system, the predicted speech signal sample is chosen either as the amplitude value of the preceeding sample or the product of that preceeding sample and a value slightly smaller than 1. Such a DPCM system is known to improve the signal-to-noise ratio by about 6 dB over a PCM system when speech signals are transmitted with the number of bits.

The signal-to-noise ratio can be further improved when a plurality of past samples are used to determine the predicted amplitude of the speech signal sample at the present time point. Thus, the predicted value $S_{ej}(n)$ of a speech signal sample $S(n)$ at a time point $j$ can be expressed by:

$$S_{ej}(n) = A_1 S_{j-1}(n) + A_2 S_{j-2}(n) + \ldots A_i S_{j-i}(n) \quad (1)$$

where $A_1, A_2, \ldots A_i$ are termed the prediction coefficients. These prediction coefficients are selected to lessen the difference, $d(n)$, between the signals $S(n)$ and $S_e(n)$. This difference, $d(n)$, is termed the prediction error.

With optimum prediction coefficients and using about 5 to 8 past samples, the signal-to-noise ratio can be improved by approximately 10 dB compared with a PCM system. Since the characteristics of a speech signal vary with time, the optimum values of the prediction coefficients also change. Therefore, minimizing the prediction error requires selecting the prediction coefficients of the predictor adaptively to the time variation of the speech signal. Such a DPCM system is called an adaptive DPCM (ADPCM) system. One example of an ADPCM system is described in U.S. Pat. No. 4,354,273 which issued Oct. 12, 1982 to Araseki et al.

It is well known that the large dynamic range of speech signals requires adaptive quantization even with differential coding and that the rate of adaptation must match the rapid power variations of the difference signal produced by a speech input. Therefore, ADPCM systems for encoding speech signals often use adaptive quantizers. For detailed discussions of adaptive quantizers in ADPCM systems, reference is made to the paper by P. Cummiskey et al, entitled "Adaptive Quantization in Differential PCM Coding of Speech", the Bell system Technical Journal, September, 1973, pp 1105–1118; and the paper by David L. Cohen et al, entitled "The Residual Encoder—An Improved ADPCM System for Speech Digitization", IEEE Transactions on Communications, Vol. COM-23, No. 9, September, 1975, pp 935941. The ADPCM system described by Araseki et al in their U.S. Pat. No. 4,354,273 includes both an adaptive quantizer and an adaptive predictor.

Figure 2:
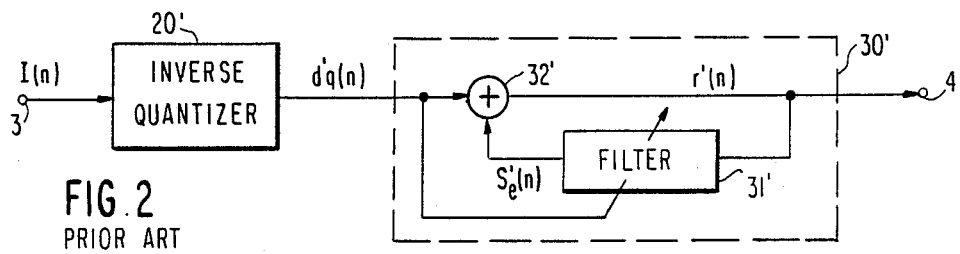
FIG. 2 is a block diagram illustrating a prior art ADPCM receiver compatible with the transmitter of FIG. 1.

FIGS. 1 and 2 represent, respectively, the transmitter and receiver of the conventional ADPCM system described in the aforementioned Araseki et al patent. The transmitter includes a subtractor 40, an adapative quantizer 10, an adaptive inverse quantizer 20, and an adaptive predictor 30. The receiver of the conventional ADPCM system includes an adaptive inverse quantizer 20' and an adaptive predictor 30'. This ADPCM system is just one example of known ADPCM systems with an adaptive quantizer and adaptive predictor. As will become apparent from the detailed description of the preferred embodiment of the invention, the present invention is not limited to the Araseki et al disclosed prior art ADPCM system. This prior art system is described herein in some detail only as an aid in understanding the teaching of the present invention.

In the operation of Araseki et al prior art ADPCM transmitter, a linear input signal $S(n)$ is supplied to terminal 1 and a predicted output $S_e(n)$ is produced by the adaptive predictor 30. The subtractor 40 performs the operation $d(n) = S(n) - S_e(n)$ to obtain a prediction error $d(n)$, which is then quantized by the adaptive quantizer 10. A normalization coefficient or quantizer step-size, $\Delta(n)$ is provided to the divider 11 from a control circuit 22 of the adaptive inverse quantizer 20. The divider 11 divides the prediction error $d(n)$ by $\Delta(n)$, thereby accomplishing amplitude normalization. The coder 12 encodes the normalized signal to produce a coded error signal $I(n)$ chosen according to the optimum quantizer step-sizes.

Figure 3:
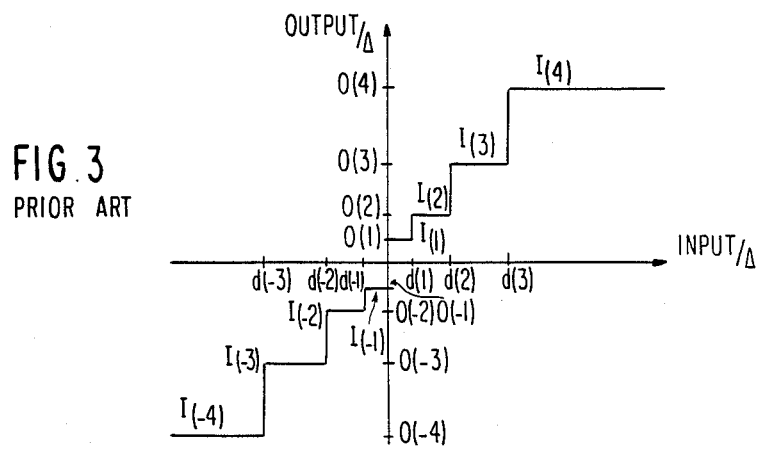
FIG. 3 illustrates the input and output characteristics of the coder and decoder of the adaptive quantizer shown in FIG. 1.

FIG. 3 represents input and output characteristics of the coder 12 and decoder 21. For the coder 12, the input is represented by the abscissa, and the output by $\pm I(n)$ where $n = 1, 2, 3, 4$ in this example. Thus, if the input to the coder 12 lies between $d(1)$ and $d(2)$, the output of the coder 12 becomes $I(2)$. The output of the coder 12 is supplied to terminal 2 for transmission to the receiver and to the decoder 12. The decoder 21 receives the coded error signals $I(n)$ and supplied the signals $\pm O(n)$ where $n = 1, 2, 3, 4$ as outputs. For example, if the input is $I(2)$, the output becomes $O(2)$. It should be understood that although eight different states of $\pm I(n)$ and $\pm O(n)$ are illustrated in this example, any number of states may be established. The output of the decoder 21 is fed to multiplier 23 where it is multiplied by the normalization coefficient or quantizer step-size $\Delta(n)$. The signal from the multiplier 23 represents the reconstruction of the prediction error which includes the quantization error. This signal, termed the quantized prediction error, is represented by $d_q(n)$.

The value $\Delta(n)$ may be calculated at each sampling time point using known codec algorithms. In Araseki et al, the quantizer step-sizes $\Delta(n)$ are determined using control circuit 22 receiving the coded error signal $I(n)$. Briefly, Araseki et al discloses a ROM storing multipliers m addressed by the signal $I(n)$. A multiplier m is produced for each $I(n)$. At each sampling time point the coefficient $\Delta(n)$ is altered by multiplying the $\Delta(n)$ at the prior sampling time point by the multiplier m determined at the given sampling time point. The presence of large prediction error $d(n)$ produces from the ROM a multiplier greater than one, while a small prediction error $d(n)$ results in a multiplier smaller than one. Thus, the coefficient $\Delta(n)$ is caused to follow the prediction error. The quantized prediction error $d_q(n)$ is input to the adaptive predictor 30, the output of which is the predicted value $S_e(n)$ of the input signal $S(n)$. The sum $S_e(n) + d_q(n)$ produced by the adder 32 is the reproduced signal $r(n)$.

Referring to FIG. 2, which illustrates a prior art ADPCM receiver compatible with the transmitter of FIG. 1, a coded error signal $I(n)$ is received at input terminal 3. The inverse quantizer 20' and adaptive predictor 30' with filter 31' have exactly the same structures as the inverse quantizer 20 and adaptive predictor 30 of the transmitter and operate in a like manner. More specifically, a reproduced signal $r(n)$ is obtained at terminal 4 by adding, in adder 32', the quantized prediction error $d'_q(n)$ with the predicted value $S'_e(n)$. Assuming no transmission or other errors, the values $d'_q(n) = d_q(n)$, $S'_e(n) = S_e(n)$, and therefore $r'(n) = r(n)$.

The coded signal $I(n)$ representing the prediction error $d(n)$ derived from an input speech sample is a bit sequence of a predetermined number of bits. As is well known, the quantization precision is directly proportional to the number of bits in the bit sequence constituting $I(n)$. That is, quantization precision is increased by increasing the number of bits defining each coded signal $I(n)$. As the number of bits per sample increases the bit rate is correspondingly increased. For example, in a system transmitting 8,000 samples per second, with each sample represented by a three bit code, a transmission bit rate of 24 kbits/sec. is realized. Should each sample be represented by a four bit code, a transmission bit rate of 32 kbits/sec. is realized. Likewise, if each sample is represented by a five bit code, the bit rate necessarily rises to 40 kbits/sec.

Situations exist where it is preferable for a codec, such as the ADPCM codec described in connection with the aforementioned Araseki et al patent, to generate the coded output signals $I(n)$ at variable bit rates. For example, in a low rate encoding/digital speech interpolation (LRE/DSI) system in which ADPCM codecs of the LRE operating with a defined algorithm such as the well-known CCITT algorithm, interface the DSI equipment, channels of both speech and data are received. While 4-bit codes transmitted at the rate of 32 kbits/sec may be sufficient to encode prediction errors derived from input speech samples arriving at the rate of 8,000 samples/sec., the performance of a 4-bit codec in response to certain data signal samples, such as voice band data (VBD) at 4.8 kbits/sec. and 9.6 kbits/sec, has been found unsatisfactory. Performance can be improved by applying such VBD signals to a 5-bit codec, for transmission at 40 kbits/sec. Further, it may sometimes be necessary to encode input speech samples using 3-bit ADPCM codecs, for transmission at 24 kbits/sec., such as during brief periods of voice channel overload.

Variable bit rate codecs can be implemented using multiple quantizers. Where codecs are used to handle speech signals with wide dynamic range, multiple adaptive quantizers may be used.

In an ADPCM codec with multiple quantizers, the prediction error d(n) is switched to the quantizer producing coded signal I(n) having the desired number of bits. Thus, when input signals can be satisfactorily quantized with a 4-bit signal, the input is switched to a fourbit quantizer. When a 5-bit quantized signal is desired, the input is switched to a 5-bit quantizer, and so on. It has been found, however, that distortion occurs whenever quantizers are switched. This distortion is believed to occur because of the finite duration required by the quantizer step-size to track the input signal.

According to a specific teaching of this invention, a variable bit rate codec such as an ADPCM codec, is constructed with multiple quantizers. This multiple quantizer codec operates such that only one quantizer at a time operates, in what is termed herein the dominant mode, on the actual difference signal d(n) between the input signal S(n) and the predicted signal $S_e(n)$. Rather than having the other quantizers dormant while the one quantizer operates in the dominant mode, they are operated in a secondary mode to up-date their stepsize in accordance with the step-size of the quantizer operating in the dominant mode. That is, while one quantizer operates in the dominant mode on the prediction error d(n) to generate the coded signal I(n) and to up-date its step-size $\Delta(n)$ on the basis of coded signal I(n), the other quantizers operate in a secondary mode to update their step-size $\Delta(n)$ on the basis of the activity in the quantizer operating in the dominant mode. Thus, when a secondary mode quantizer is switched to the dominant mode to thereby operate on the actual prediction error d(n), minimal time is required for tracking the input signal reducing the quantizing distortion during bit rate (i.e., quantizer switching) transitions.

More specifically, according to the teachings of this invention, while a quantizer is operating in the dominant mode on the prediction error d(n), the other quantizers receive the quantized prediction error $d_q(n)$ produced by the dominant mode quantizer to update their step-size $\Delta(n)$ in accordance with the value $d_q(n)$ received from the dominant mode quantizer.

Figure 4:
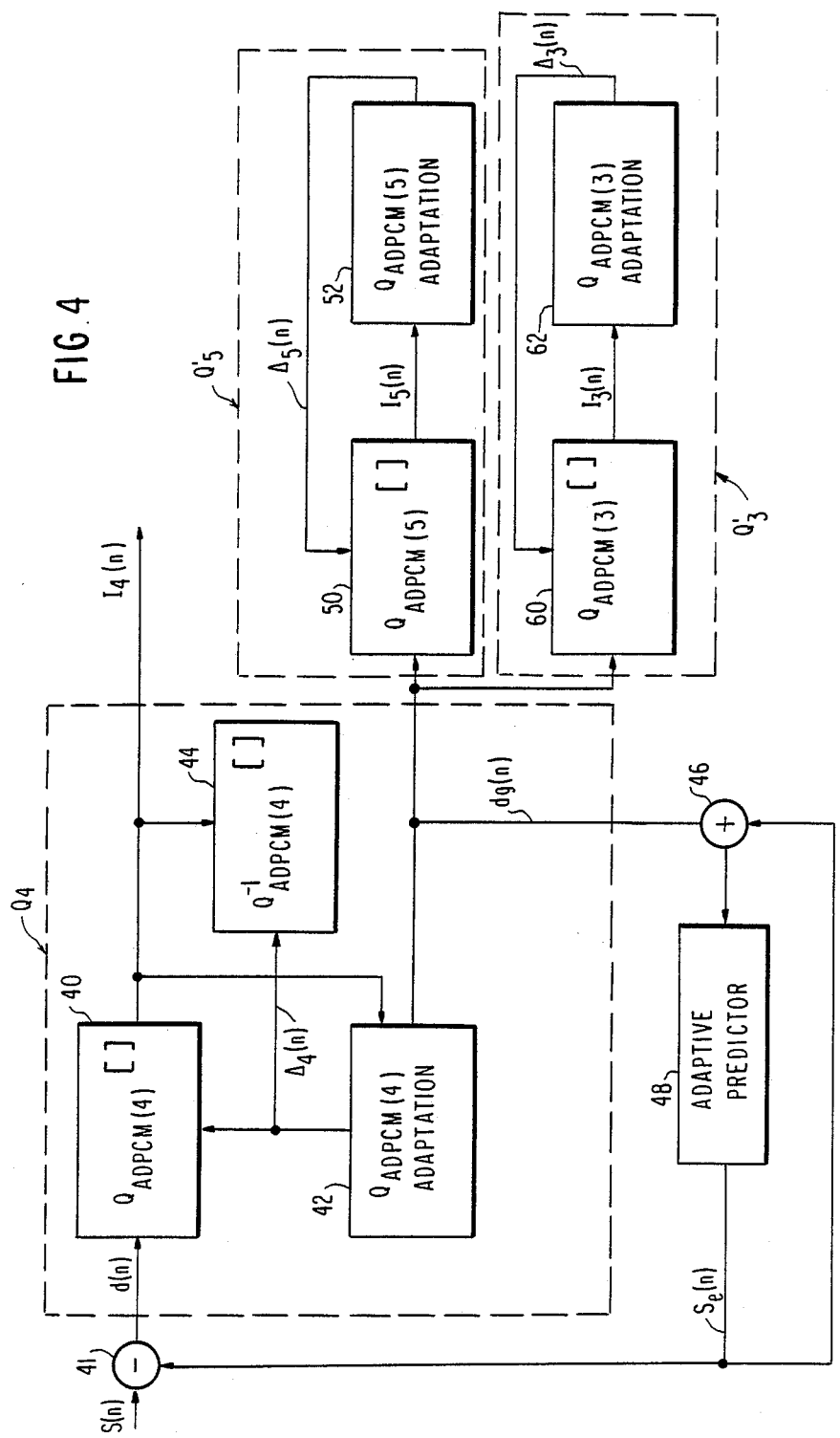
FIG. 4 is a block diagram illustrating an ADPCM transmitter with multiple quantizers constructed in accordance with the teachings of this invention.

The invention will now be explained with reference to a preferred embodiment illustrated in FIG. 4 in which an ADPCM codec is constructed with three adaptive quantizers, namely, a 3-bit quantizer, a 4-bit quantizer and a 5-bit quantizer. The codec of FIG. 4 is comprised of quantizers Q3, Q4, and Q5, adaptive predictor 48, and adder 46 for adding the quantized prediction error $d_q(n)$ produced by the dominant mode quantizer, which in FIG. 4 is the quantizer Q4, to the predicted value $S_e(n)$ produced by the adaptive predictor 48. The predicted value $S_e(n)$ is also subtracted from the linear input signal S(n) in subtractor 41 to produce the prediction error d(n). For simplicity and to facilitate the explanation of the preferred embodiment, only the quantizer Q4 is illutrated in its complete form. Quantizers Q3 and Q5 are only partially illustrated and therefore labeled Q'3 and Q'5 in FIG. 4. It should be understood that like quantizer Q4 each of the other quantizers includes not only a coder, such as coder 40, and a stepsize adaptation control circuit such as control circuit 42, but also a decoder, such as decoder 44. At this point it should also be understood that coder 40 of quantizer Q4 is a 4-bit coder, coder 50 of quantizer Q'5 is a 5-bit coder, while coder 60 of quantizer Q'3 is a 3-bit coder. The coders 40, 50 and 60 are analogous to the circuit of FIG. 1 consisting of divider 11 and coder 12. Step-size adaptation control circuits 42, 52 and 62 are analogous to the control circuit 22 of FIG. 1. Further, the decoder 44, and the decoders of the quantizers Q3 and Q5 (not shown) are analogous to the circuit of FIG. 1 consisting of decoder 21 and multipler 23. Once again, the block Q'5 represents the portion of quantizer Q5 corresponding to the 5-bit coder 50 and its step-size control circuit 52, while block Q'3 represents that portion of quantizer Q3 corresponding to the 3-bit coder 60 and its step-size control circuit 62. The decoder portions of quantizers Q3 and Q5 and the connection of these decoder outputs to adder 46 and predictor 48 have been omitted from the FIG. 4 illustration to facilitate the description of this preferred embodiment of the invention.

Although not shown in FIG. 4, it is to be understood that when quantizer Q5 is operating in the dominant mode, coder 40 and coder 60 are each connected to receive the quantized prediction error $d_q(n)$ produced by quantizer Q5. Likekwise, when quantizer Q3 is operating in the dominant mode, coder 40 and coder 50 are each connected to receive the quantized prediction error $d_q(n)$ produced by quantizer Q3.

In operation of the multiple quantizer codec illustrated in FIG. 4, with quantizer Q4 selected through suitable switching (not shown) to operate in the dominant mode, the prediction error d(n) is applied to the coder 40 which operates in the manner explained hereinbefore in connection with FIG. 1 to produce the coded error signal $I_4(n)$ for transmission to a compatible receiver while the signal $I_4(n)$ is also input to the decoder 44 and the adaptation control circuit 42 to produce, respectively, the quantized prediction error $d_q(n)$ and the optimum step-sizes $\Delta_4(n)$. The quantized prediction error is now input not only to the adder 46 but also to the coders 50 and 60 set to operate in the secondary mode. Receipt of signal $d_q(n)$ causes the coders 50 and 60 and their respective adaptation control circuits to perform their respective operations whereby the coders produce the coded signals $I_3(n)$ and $I_5(n)$ which are input to their respective control circuits 52, 62 which operate to up-date the quantizer step-sizes $\Delta_3(n)$ and $\Delta_5(n)$. When either quantizer Q3 or Q5 is operating in the dominant mode, the other quantizers Q4 and Q5 or Q4 and Q3 operate in a secondary mode in the manner just described in respect to quantizers Q3 and Q5 operating in a secondary mode. Changing the quantizer operating in the dominant mode may be effected by simply switching the coder input of the dominant mode quantizer to receive the prediction error d(n), while the coder inputs of the secondary mode quantizers are switched to receive the $d_q(n)$ signal from the dominant mode quantizer. The I(n) code from the dominant mode quantizer is transmitted to the receiver by simply switching its output to the transmission circuitry.

Figure 5:
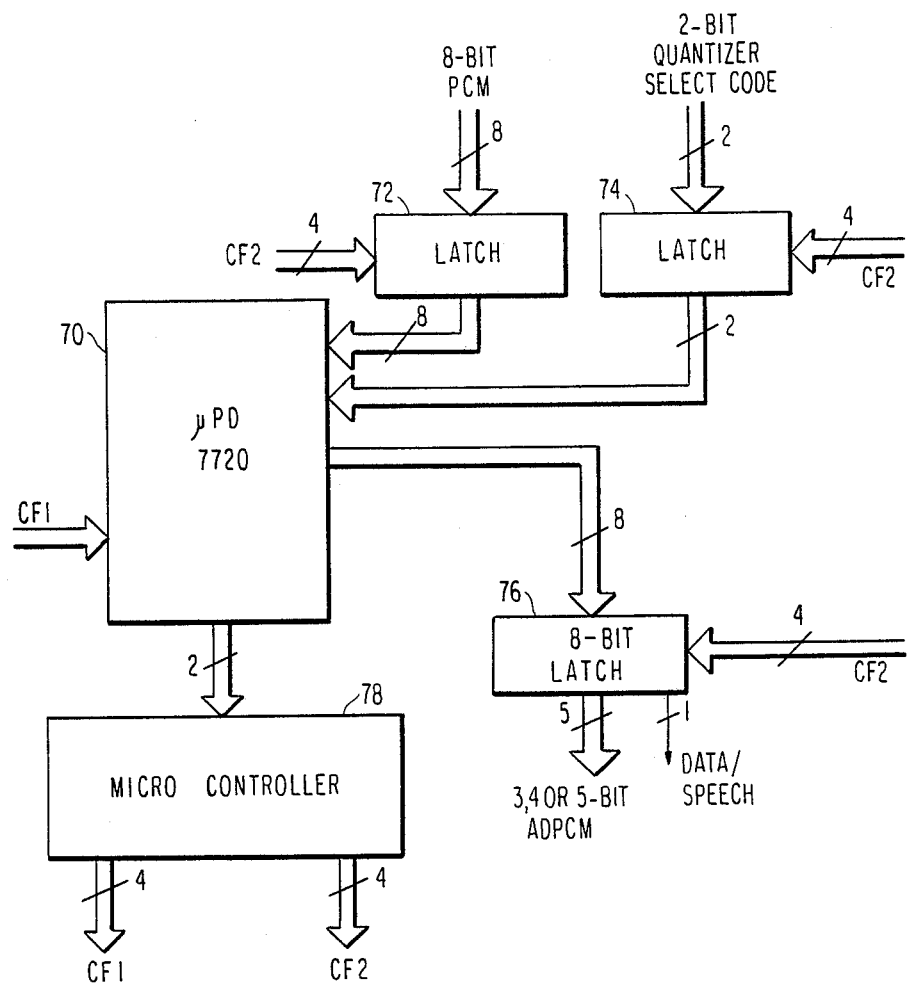
FIG. 5 is a block diagram of the multiple adaptive quantizer ADPCM transmitter constructed in accordance with the teachings of this invention incorporated into a digital speech processor.

The multiple quantizer codec of this invention may be implemented with a conventional digital speech processor (DSP) 70 such as NEC's μPD 7720 DSP chip and latches 72, 74 as illustrated in FIG. 5. Assuming 8-bit input signal samples, the samples are input to the DSP through an 8-bit latch 72. A 2-bit latch 74 may be used to indicate the dominant mode quantizer. Practically, latch 74 may also be an 8-bit latch with only 2 bits being used. The output of the μPD 7720 DSP 70 consists of 8-bits, of which up to 5 bits can be used to transmit the ADPCM code $I_x(n)$, where x=3, 4, or 5 in this example. The remaining 3 bit positions can be used for other formation. For example, one of these bit positions can be used to indicate if the ADPCM code $I_x(n)$ represents data or speech. The DSP 70 output sets the states of latch 76 to provide the necessary output signals foro transmission. The latches 72, 74, 76 and DSP 70 are controlled by a micro-programmed controller 78. This controller may produce two groups of control bits CF1 and CF2 with each group in this example comprised of 4 bits. Control group CF1 controls the DSP 70. Control group CF2 controls the latches 72, 74 and 76. Programming the micro-controller 78 to switch any one of the DSP quantizers to dominant mode to receive the actual prediction error $d(n)$ and the other quantizers to secondary mode to receive the quantized prediction error $d_q(n)$ of the dominant mode quantizer is straight forward and does not require any special programming skills. Therefore, a further description of the micro-controller programming is omitted as being unnecessary for a full and complete understanding of this invention.

While the invention has been described in detail and with reference to specific embodiments thereof, it will be apparent to one skilled in the art that various changes and modifications can be made therein without departing from the spirit and scope thereof.

What is claimed is:

1. A multiple quantizer, backward-type codec comprising:
   input signal receiving means;
   a plurality of adaptive quantizers, each for producing quantized signals representing an input signal thereto;
   means for causing a selected one of said plurality of adaptive quantizers to receive an input signal from said input signal receiving means and produce quantized signals representing said received input signal,
   means for causing the others of said plurality of adaptive quantizers to receive a quantized signal produced by the selected one of said plurality of quantizers and to up-date their respective quantizing step-size on the basis of the received quantized signal.

2. The multiple quantizer, backward-type codec as claimed in claim 1, wherein each of said plurality of adaptive quantizers includes adaptive coder means responsive to an input signal for producing a coded digital signal of a preselected number of bits representing a quantized version of the input signal, adaptive decoder means for decoding the coded digital signal to produce a quantized input signal, and adaptation control circuit means for altering the quantizer step-size in response to changes in the input signal.

3. The multiple quantizer, backward-type codec as claimed in claim 2, wherein said codec further includes an adaptive predictor responsive to at least one output from said selected one of said plurality of quantizers for producing a predicted signal.

4. The multiple quantizer, backward-type codec as claimed in claim 3, wherein said adaptive predictor is responsive to the quantized input signal from the selected one of said plurality of quantizers, and further including combiner means responsive to said quantized input signal and the predicted signal for producing a reconstructed signal, the output of said combiner means being connected to said predictor.

5. The multiple quantizer, backward-type codec as claimed in claim 4, further including means for selectively connecting the output of the decoder means of a selected one of said plurality of quantiers to said combiner means.

6. A variable bit rate, ADPCM transmission system comprising:
   signal sample $S(n)$ receiving means;
   a plurality of adaptive quantizers, each of said quantizers including adaptive coder means producing a coded signal $I(n)$ in the form of a bit sequence having a predetermined number of bits, said signal $I(n)$ representing a quantized version of the input signal to the quantizer, decoder means for decoding coded signal $I(n)$ to produce a quantized input signal $d_q(n)$, and control circuit means for altering the quantizing step-size in response to changes in the level of the quantizer input signal;
   at least one predictor receiving an output from a selected one of said plurality of quantizers to produce a predicted signal $S_e(n)$;
   a subtractor for subtracting the signal sample $S(n)$ from the predicted signal $S_e(n)$ for producing the quantizer input signal $d(n)$;
   means for connecting an output from a selected one of said plurality of quantizers to said at least one predictor and connecting the input of each of the others of said plurality of quantizers to receive the quantized input signal $d_q(n)$ from the selected one of said plurality of quantizers; and
   means for altering the quantizer step-size in said others of said plurality of quantizers in accordance with variations in the size of said quantized input signal $d_q(n)$.

* * * * *